(12) United States Patent
Liu et al.

(10) Patent No.: US 11,370,653 B2
(45) Date of Patent: Jun. 28, 2022

(54) ELECTROSTATIC ZIPPER

(71) Applicant: Facebook Technologies, LLC, Menlo Park, CA (US)

(72) Inventors: Tianshu Liu, Redmond, WA (US); Yigit Menguc, Kirkland, WA (US); Robert Manson, Seattle, WA (US); Shawn Reese, Renton, WA (US); Tristan Thomas Trutna, Seattle, WA (US); Erik Samuel Roby, Redmond, WA (US); Katherine Healy, Redmond, WA (US); Nicholas Colonnese, Kirkland, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 100 days.

(21) Appl. No.: 16/856,096

(22) Filed: Apr. 23, 2020

(65) Prior Publication Data
US 2021/0284525 A1 Sep. 16, 2021

Related U.S. Application Data

(60) Provisional application No. 62/990,210, filed on Mar. 16, 2020.

(51) Int. Cl.
*B81B 3/00* (2006.01)
*H02N 1/00* (2006.01)
(Continued)

(52) U.S. Cl.
CPC .......... *B81B 3/0021* (2013.01); *B81B 3/0051* (2013.01); *F04B 43/04* (2013.01);
(Continued)

(58) Field of Classification Search
CPC ..... B81B 3/0021; B81B 3/0051; H01L 41/09; H01L 41/04; H01L 41/193; F04B 43/04;
(Continued)

(56) References Cited

U.S. PATENT DOCUMENTS

| 6,351,054 B1 * | 2/2002 | Cabuz | H02N 1/006 318/116 |
| 2002/0097303 A1 * | 7/2002 | Gulvin | H02N 1/006 347/65 |

(Continued)

FOREIGN PATENT DOCUMENTS

WO 2019/166635 A1 9/2019

OTHER PUBLICATIONS

International Search Report and Written Opinion received for PCT Application Serial No. PCT/US2021/016513 dated May 10, 2021, 14 pages.
(Continued)

*Primary Examiner* — Yasser A Abdelaziez
(74) *Attorney, Agent, or Firm* — FisherBroyles, LLP

(57) ABSTRACT

An electrostatic zipping actuator includes a primary electrode, a secondary electrode overlying the primary electrode, a dielectric layer located between and abutting at least a portion of the primary electrode and the secondary electrode, and a dielectric fluid disposed at least at a junction between the dielectric layer and one of the electrodes, where an average total thickness of the dielectric layer is less than approximately 10 micrometers.

21 Claims, 13 Drawing Sheets

(51) Int. Cl.
   *F04B 43/04* (2006.01)
   *H01L 41/193* (2006.01)
   *H01L 41/04* (2006.01)
   *H01L 41/09* (2006.01)
   *F04B 43/14* (2006.01)
   *A41D 1/00* (2018.01)

(52) U.S. Cl.
   CPC ............. *F04B 43/14* (2013.01); *H01L 41/04* (2013.01); *H01L 41/09* (2013.01); *H01L 41/193* (2013.01); *H02N 1/006* (2013.01); *A41D 1/002* (2013.01)

(58) Field of Classification Search
   CPC .......... F04B 43/14; G06F 3/011; G06F 3/016; H02N 1/006; A41D 1/002
   See application file for complete search history.

(56) References Cited

U.S. PATENT DOCUMENTS

| | | | | |
|---|---|---|---|---|
| 2007/0120438 | A1* | 5/2007 | Divoux | H02N 1/006 310/309 |
| 2011/0032624 | A1* | 2/2011 | Bolis | G02B 26/0825 359/666 |
| 2013/0114148 | A1* | 5/2013 | Aschwanden | G02B 26/004 359/666 |
| 2018/0303383 | A1* | 10/2018 | Connor | G06F 3/011 |

OTHER PUBLICATIONS

Boys et al., "Soft wearable non-vibratory tactile displays", IEEE International Conference of Soft Robotics (RoboSoft), Apr. 24-28, 2018, pp. 270-275.

Shikida et al., "Electrostatically Driven Gas Valve with High Conductance", Journal of Microelectromechanical Systems, vol. 3, No. 2, Jun. 1994, pp. 76-80.

Yobas et al., "A Novel Bulk-Micromachined Electrostatic Microvalve with a Curved-Compliant Structure Applicable for a Pneumatic Tactile Display", Journal of Microelectromechanical Systems, vol. 10, No. 2, Jun. 2001, pp. 187-196.

Kellaris et al., "Peano-HASEL actuators: Muscle-mimetic, electrohydraulic transducers that linearly contract on activation", Science Robotics, vol. 3, eaar3276, Jan. 5, 2018, 11 pages.

Taghavi et al., "Electro-ribbon actuators and electro-origami robots", Science Robotics, vol. 3, eaau9795, Dec. 19, 2018, 13 pages.

Sirbu et al., "Electrostatic actuator for tactile display based on hydraulically coupled dielectric fluids and soft structures", Proceedings of SPIE, vol. 0966, Electroactive Polymer Actuators and Devices (EAPAD) XXI, 109662D, Mar. 19, 2019, 7 pages.

Chang et al., "Electrostatically-driven elastomer components for user-reconfigurable high density microfluidics", Lab Chip, vol. 9, 2009, pp. 1274-1281.

Zhang et al., "Electrostatically Actuated Robotic Fish: Design and Control for High-Mobility Open-Loop Swimming", IEEE Transactions on Robotics, vol. 24, No. 1, Feb. 2008, pp. 118-129.

Niino et al., "Electrostatic Artificial Muscle: Compact High-Power Linear Actuators with Multiple-Layer Structures", Proceedings IEEE Micro Electro Mechanical Systems an Investigation of Micro Structures, Sensors, Actuators, Machines and Robotic Systems, 1994, pp. 130-135.

\* cited by examiner

ELECTROSTATIC ZIPPER

CROSS-REFERENCE TO RELATED APPLICATION

This application claims the benefit of priority under 35 U.S.C. § 119(e) of U.S. Provisional Application No. 62/990,210, filed Mar. 16, 2020, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
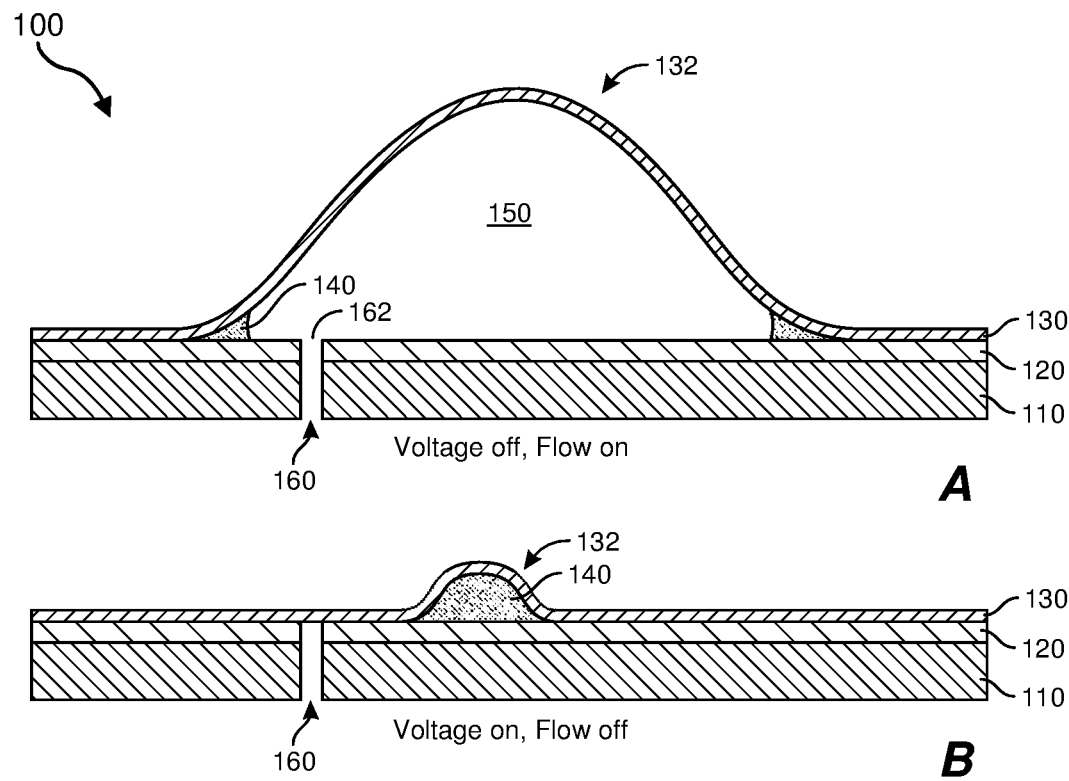
FIG. 1 is a schematic cross-sectional view showing the operation of an electrostatic zipping valve according to various embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is directed generally to electrostatically driven devices and more particularly to electrostatic actuators, i.e., zipping actuators, their methods of manufacture, and their methods of use.

Electrostatic zipping actuators operate in accordance with Coulomb's Law where the electrostatic force between oppositely charged electrodes is inversely proportional to the square of the distance between the electrodes. Paired electrodes disposed in an opposing, overlapping manner and separated by a dielectric layer (sometimes referred to herein as a "barrier layer") may be reversibly drawn together or forced apart by applying a suitable inter-electrode bias (voltage). Electrostatic zipping actuators may be implemented in various devices, including fluid valves, tactile actuators, kinesthetic actuators, shear actuators, and peristaltic pumps where high forces and large displacements are typically desired.

As will be appreciated, however, at higher working voltages, which may be needed to generate higher pressures for securely closing a valve, for instance, such devices may be prone to electrical short circuits that decrease reliability and may lead to failure in the field. In particular, in an un-zipped or partially zipped actuator, the dielectric breakdown of air that is present within the inter-electrode gap may create an electrostatic shield that decreases or eliminates the electrostatic attraction between the electrodes. In addition, in certain aspects, adhesion such as between one or more actuator electrodes and the intervening dielectric layer may inhibit the realization of continuously tunable, rapidly adjustable operation. Moreover, defects in the dielectric layer, which are ubiquitous in the manufacture of such materials, may adversely affect the electrical performance of the device. Notwithstanding recent developments, the realization of high reliability, mechanically robust electrostatic actuators capable of rapid and repeated actuation would be beneficial.

In accordance with various embodiments, operation of electrostatic zipping actuators having mechanically compliant electrodes and capable of exerting large pressures may be achieved by positioning a thin, uniform, and mechanically robust dielectric layer between paired electrodes, e.g., by attaching a dielectric layer to one or both of the electrodes, and by supplementing the dielectric layer with a dielectric fluid located proximate to a region where the dielectric layer contacts an adjacent electrode. In some embodiments, the dielectric layer may be a solid dielectric layer.

A variety of materials may be used to form the electrodes. In embodiments where a single electrode is configured to zip and unzip, the opposing electrode may include a substantially rigid conductive substrate, such as a doped semiconductor (e.g., silicon) or metal substrate. In such embodiments or in embodiments where both electrodes are configured to zip and unzip, one or both of the electrodes may include a layer of a conductive polymer, such as doped polydimethylsiloxane (PDMS). That is, one or more of the zipping electrodes may include a mechanically compliant or substantially mechanically compliant material.

In some examples, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least 90% met, at least 95% met, or even at least 99% met.

The electrodes in some embodiments may be configured to stretch elastically. In some embodiments, an electrode may include a polymer composite including a low surface tension polymer matrix having conductive particles, e.g., carbon black, dispersed throughout the matrix. The polymer matrix may include silicones, acrylates, silicone-acrylates, and other elastomers. Example low surface tension polymers may include poly(tetrafluoroethylene), polyvinylidene fluoride, or poly(dimethyl siloxane). Further example electrodes may include poly(3,4-ethylenedioxythiophene) polystyrene sulfonate (PEDOT:PSS).

Conductive (doped) polydimethylsiloxane (cPDMS) may be manufactured by dispersing conductive particles (e.g., flakes, nanorods, etc.) throughout the matrix of a PDMS polymer. The electrodes may include one or more electrically conductive materials, such as a metal, carbon nanotubes, graphene, oxidized graphene, fluorinated graphene, hydrogenated graphene, other graphene derivatives, and carbon black, for example. The conductive particles may include metal nanoparticles, metal nanowires, graphene nanoparticles, graphene flakes, transparent conducting oxide nanoparticles, and the like. In some embodiments, the electrodes may have an electrical conductivity of at least approximately 1 S/cm.

In certain embodiments, a compliant electrode layer may have an average thickness of from approximately 500 nm to approximately 500 micrometers, e.g., approximately 500 nm, approximately 1 micrometer, approximately 2 micrometers, approximately 5 micrometers, approximately 10 micrometers, approximately 20 micrometers, approximately 50 micrometers, approximately 100 micrometers, approximately 200 micrometers, or approximately 500 micrometers, including ranges between any of the foregoing values.

The dielectric layer may include an organic material or an inorganic material such as silicon dioxide ($SiO_2$), for example. An average thickness of the dielectric layer may be less than approximately 10 micrometers, e.g., less than approximately 1 micrometer. In certain embodiments, the average thickness of the dielectric layer may range from approximately 20 nm to approximately 10 micrometer, e.g., approximately 20 nm, approximately 50 nm, approximately 100 nm, approximately 200 nm, approximately 500 nm, approximately 1 micrometer, approximately 2 micrometers, approximately 5 micrometers, or approximately 10 micrometers including ranges between any of the foregoing values.

According to some embodiments, a dielectric layer may include any suitable deformable material, such as polytetrafluoroethylene, polyurethane, a fluoro-elastomer and/or a silicone elastomer. In some embodiments, the dielectric layer may be pre-stretched (pre-strained) up to approximately 100%, e.g., 1, 2, 5, 10, 20, 30, 40, 50, 60, 70, 80, 90, or 100% strain, including ranges between any of the foregoing values. In some embodiments, the line tension within the dielectric layer may be less than approximately 50 N/m, e.g., 5, 10, 20, or 50 N/m, including ranges between any of the foregoing values. Higher line tension may favorably decrease incidences of sticking between an electrode and the dielectric layer during unzipping. That is, sufficient line tension within the dielectric layer may promote debonding of the dielectric layer from an adjacent electrode.

The dielectric fluid may include silicone oil, although additional dielectric fluid compositions such as dielectric esters are contemplated. The dielectric fluid may be a compressible fluid or an incompressible fluid. As will be appreciated by one skilled in the art, capillary forces may act to hold the dielectric fluid at the juncture between the dielectric layer and an adjacent electrode.

In certain embodiments, the disclosed electrostatic zipping actuators may generate a pressure upon actuation of up to approximately 200 kPa at operating voltages of less than approximately 1 kV. For instance, a generated pressure may be approximately 10 kPa, approximately 20 kPa, approximately 50 kPa, approximately 100 kPa, or approximately 200 kPa, including ranges between any of the foregoing values. An operating voltage may be approximately 20V, approximately 50V, approximately 100V, approximately 200V, approximately 500V, or approximately 1000V, including ranges between any of the foregoing values.

An electrostatic zipping actuator may include a primary electrode, a secondary electrode overlying the primary electrode, at least one dielectric layer located between and abutting at least a portion of the primary electrode and the secondary electrode, and a dielectric fluid disposed at a junction between the at least one dielectric layer and one of the electrodes, where an average total thickness of the dielectric layer(s) is less than approximately 10 micrometers, e.g., less than approximately 1 micrometer.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-15, detailed descriptions of electrostatically driven actuators and devices including such actuators. The discussion associated with FIGS. 1-9 includes a description of electrostatic zipping actuator structures according to various embodiments. The discussion associated with FIGS. 10-15 relates to exemplary virtual reality and augmented reality devices that may include an electrostatically driven actuator as disclosed herein.

An electrostatic zipping actuator may include a pair of conductive electrodes and a dielectric layer disposed between the electrodes. Referring to FIG. 1A, for example, electrostatic zipping actuator 100 may include a primary electrode 110, a dielectric layer 120 overlying the primary electrode 110, and a secondary electrode 130 overlying the dielectric layer 120. The primary electrode 110 may include a doped silicon substrate, for example, and the secondary electrode 130 may include a compliant material such as conductive PDMS. The electrostatic zipping actuator 100 may further include a dielectric fluid 140 located proximate to the interface between the secondary electrode 130 and the dielectric layer 120. An air gap 150 may be present between the dielectric layer 120 and the secondary electrode 130, and the dielectric fluid 140 may be located within the air gap 150.

FIG. 1A shows electrostatic zipping actuator 100 in an unactuated state. In the unactuated state, due to air pressure within the air gap 150, secondary electrode 130 may be deformed and spaced away from a portion of an upper surface of dielectric layer 120 and hence spaced away from an opening 162 of an aperture 160 that extends through the dielectric layer 120 and through the primary electrode 110.

According to some embodiments, by applying a bias to one or more of the electrodes (i.e., the primary electrode 110 and/or the secondary electrode 130), the attendant voltage gradient may create an electrostatic force that induces mutual attraction between the electrodes. The electrostatic attraction and the effect of the attendant displacement of the secondary electrode 130 on the shape of the zipping actuator 100 is illustrated schematically in FIG. 1B, where under the application of an applied voltage, secondary electrode 130 may be drawn toward primary electrode 110 increasing the contact area between the secondary electrode 130 and the dielectric layer 120. A decrease in the radius of curvature of the secondary electrode 130 along a non-linear portion 132 thereof may also accompany actuation of the zipping actuator 100.

By increasing the contact area between the secondary electrode 130 and the dielectric layer 120, secondary electrode 130 may overlie the opening 162 in aperture 160 or otherwise close the flow path between aperture 160 and a further aperture (not shown). In some embodiments, secondary electrode 130 may overlie opening 162 or otherwise close a flow path with sufficient force to prevent the flow of fluid through the aperture 160 or along the flow path. In this regard, zipping actuator 100 may operate as a valve, where the flow of a gas or a liquid through aperture 160 may be enabled when the actuator 100 is in an unactuated state, as shown in FIG. 1A, or disabled when the actuator 100 is in an actuated state, as shown in FIG. 1B.

Example dielectric materials for the dielectric layer 120 may include polytetrafluoroethylene, fluorinated polymers, such as polyvinylidene fluoride or poly(vinylidene fluoride-co-hexafluoropropylene). A further example dielectric material may include polysilsesquioxane. In some cases, the dielectric layer located between the electrodes may include silicon nitride or a metal oxide such as aluminum oxide or silicon dioxide. In some cases, the dielectric layer may further include embedded nanoparticles to increase the dielectric constant thereof. Example nanoparticles may include barium titanate, $TiO_2$, $CeO_2$, $BaSrTiO_3$, $PbZrTiO_3$, $PbLaZrTiO_3$, $PbMgNbO_3+PbTiO_3$, $Ta_2O_5$, $Al_2O_3$, and the like.

The applied voltage may be a constant voltage or a periodically applied voltage. For instance, a pulsed drive scheme may be implemented, which may beneficially decrease the overall required operational power, and also decrease parasitic effects otherwise associated with the long-term application of an applied field between the two electrodes.

Figure 2:
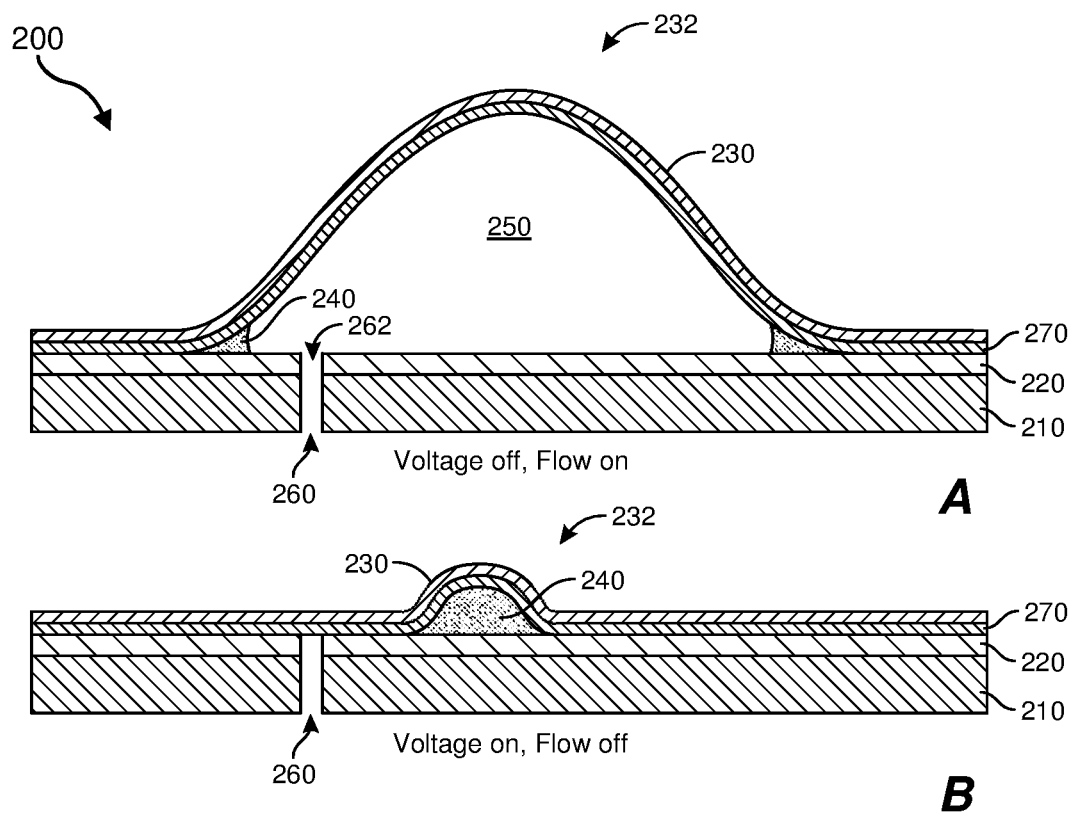
FIG. 2 is a schematic cross-sectional view showing the operation of an electrostatic zipping valve according to further embodiments.

According to further embodiments, with reference to FIG. 2, an electrostatic zipping actuator (i.e., valve) 200 may include a primary electrode 210, a primary dielectric layer 220 overlying the primary electrode 210, a secondary dielectric layer 270 overlying the primary dielectric layer 220, and a secondary electrode 230 overlying the secondary dielectric layer 270. Incorporation of the secondary dielectric layer 270 into zipping actuator 200 may enable a broader range of properties and hence a broader range of materials for the underlying and/or overlying layers. For example, the secondary dielectric layer 270 may enable the selection of a more compliant secondary electrode 230. The electrostatic zipping actuator 200 may further include a dielectric fluid 240 located proximate to the interface between the secondary dielectric layer 270 and the primary dielectric layer 220 within air gap 250.

As in the embodiment of FIG. 1, by applying a bias to one or more of the electrodes (i.e., the primary electrode 210 and/or the secondary electrode 230), the voltage gradient may create an electrostatic force that induces mutual attraction between the electrodes whereby the secondary electrode 230 may be drawn toward primary electrode 210 increasing the contact area between the dielectric layers 220 and 270 and decreasing the radius of curvature of the secondary electrode 230 along a non-linear portion 232 thereof.

By increasing the contact area between the secondary dielectric layer 270 and the primary dielectric layer 220, secondary dielectric layer 270 may overlie opening 262 in aperture 260 or otherwise close the flow path between aperture 260 and a further aperture (not shown). In some embodiments, secondary dielectric layer 270 may overlie opening 262 or otherwise close a flow path with sufficient force to prevent the flow of fluid through the aperture 260 or along the flow path. In this regard, zipping actuator 200 may operate as a valve, where the flow of a gas or a liquid through aperture 260 may be enabled when the actuator 200 is in an unactuated state, as shown in FIG. 2A, or disabled when the actuator 200 is in an actuated state, as shown in FIG. 2B.

Figure 3:
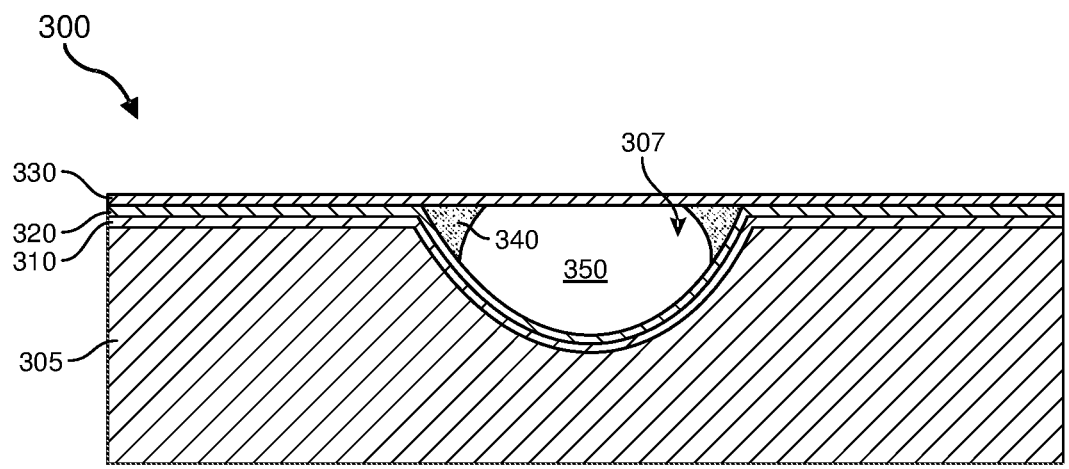
FIG. 3 is a schematic illustration of an electrostatic zipping valve according to some embodiments.

Referring to FIG. 3, shown is a further example electrostatic zipping actuator. Electrostatic zipping actuator 300 may include, from bottom to top, a substrate 305, a primary electrode 310, a dielectric layer 320, and a secondary electrode 330. In some embodiments, zipping actuator 300 may include a further dielectric layer (not shown) between the dielectric layer 320 and the secondary electrode 330. Substrate 305 may include a non-conductive organic or inorganic material, such as a polymer, glass, or ceramic composition. By way of example, substrate 305 may include a transparent material, such as a polycarbonate, polyacrylate, or epoxy composition.

According to various embodiments, the substrate 305 may include regions that are planar, concave, or convex. For instance, in the illustrated embodiment, substrate 305 may include a concave region 307, and the primary electrode 310 and the dielectric layer 320 may include conformal layers that overlie substrate 305, including within concave region 307. The electrostatic zipping actuator 300 may further include a dielectric fluid 340 located within gap 350 proximate to the interface between the dielectric layer 320 and the secondary electrode 330.

In response to an applied voltage between the primary electrode 310 and the secondary electrode 330, the secondary electrode 330 may be drawn toward primary electrode 310, i.e., within concave region 307. The incorporation of the dielectric fluid 340 proximate to the interface between the dielectric layer 320 and the overlying zipping electrode 330 may inhibit the dielectric breakdown of gases within gap 350 during actuation of the device. As in the previous embodiments, electrostatic zipping actuator 300 may be adapted to operate as a fluid valve where reversible deformation of the secondary electrode 330 may be used to open and close a fluid aperture or fluid path (e.g., gap 350).

Figure 4:
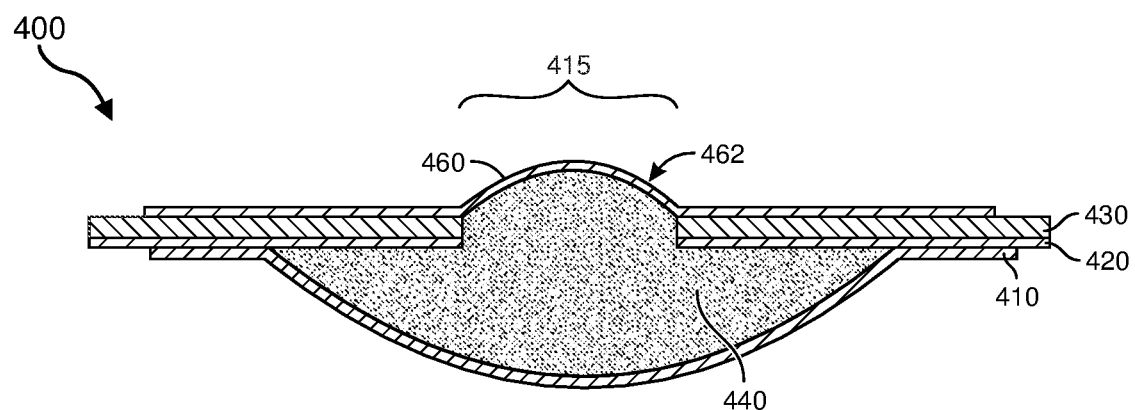
FIG. 4 is a cross-sectional illustration of an electrostatic zipping tactile actuator according to some embodiments.

According to further embodiments, an electrostatic zipping actuator may be configured to operate as a zipping tactile actuator. Referring to FIG. 4, for example, an electrostatic zipping actuator 400 may include a primary electrode 410, a dielectric layer 420 overlying and in contact with a portion of the primary electrode 410, and a secondary electrode 430 overlying the dielectric layer 420. Primary electrode 410 may be a compliant electrode and secondary electrode 430 may be a rigid electrode. In the illustrated embodiment, the dielectric layer 420 and the overlying secondary electrode 430 may be co-extensive and bifurcated to form a gap region 415. In some embodiments, a further dielectric layer (not shown) may overlie a surface of the primary electrode 410 adjacent to the dielectric layer 420, i.e., between the primary electrode and the dielectric layer 420. By way of example, such a further dielectric layer may be bonded to the primary electrode 410.

Electrostatic zipping actuator 400 may further include a fixed volume of dielectric fluid 440 located between the primary electrode 410 and the dielectric layer 420. A distensible membrane 460 may overlie the secondary electrode 430 and span the gap region 415 to directly overlie the dielectric fluid 440 within the gap region 415. Distensible membrane 460 may include an outer contact surface 462 that may be configured to contact a body part of a user.

In an exemplary method, a voltage may be applied across the primary and secondary electrodes 410, 430, which may drive the primary electrode 410 into contact with the dielectric layer 420 and exert pressure on the dielectric fluid 440. The increased fluid pressure may outwardly stretch distensible membrane 460 within the gap region 415, causing outer contact surface 462 to interact with the body part of a user.

Figure 5:
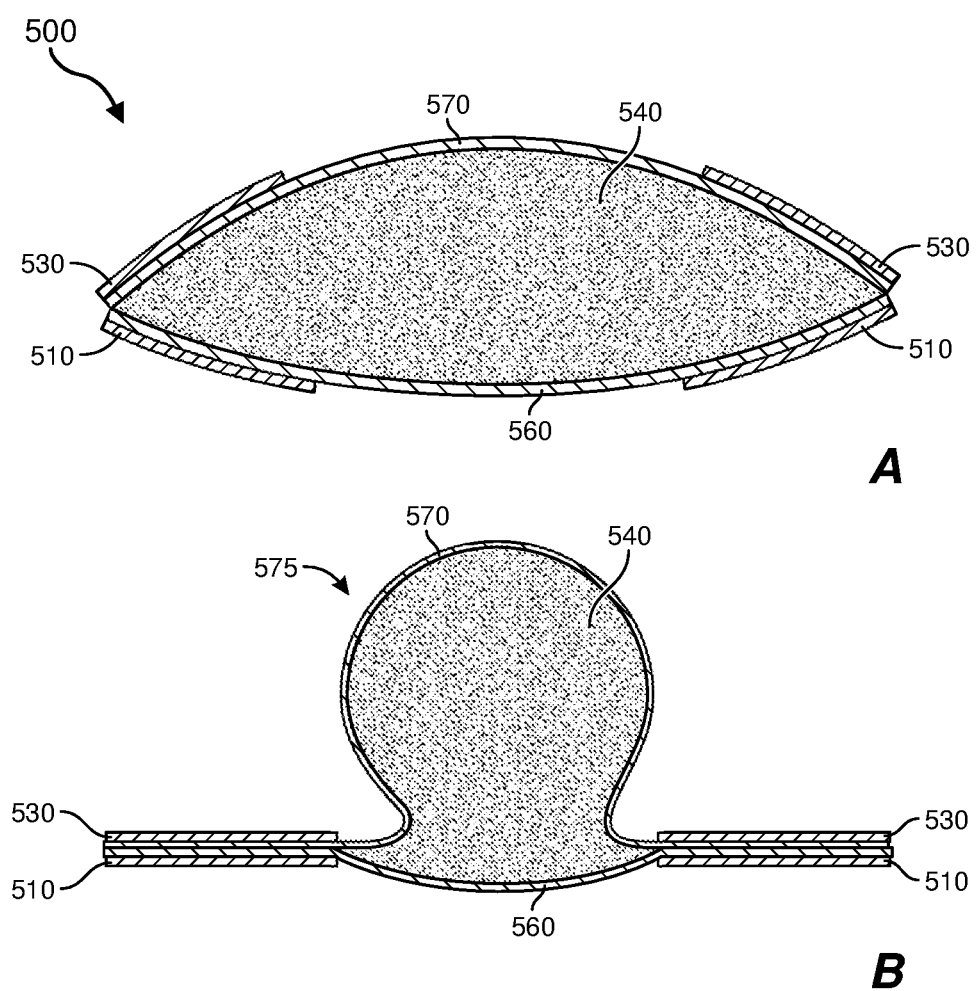
FIG. 5 shows cross-sectional illustrations of an electrostatic zipping tactile actuator according to further embodiments.

Aspects of a further example electrostatic zipping tactile actuator are illustrated in FIG. 5. Referring to FIG. 5A, electrostatic zipping actuator 500 may include segmented primary and secondary electrodes 510, 530 and, in lieu of rigid elements such as dielectric layer 420 and rigid secondary electrode 430, as shown in the previous embodiment, electrostatic zipping actuator 500 may include compliant primary and secondary dielectric membranes 560, 570, respectively, located between the electrodes 510, 530. Electrostatic zipping actuator 500 may further include a fixed volume of dielectric fluid 540 located between the primary membrane 560 and the secondary membrane 570. Referring to FIG. 5B, in examples where primary membrane 560 may be less compliant than secondary membrane 570, actuation of the zipping actuator 500 may compress dielectric fluid 540 and expand secondary membrane 570 creating a tactile bubble 575.

Figure 6:
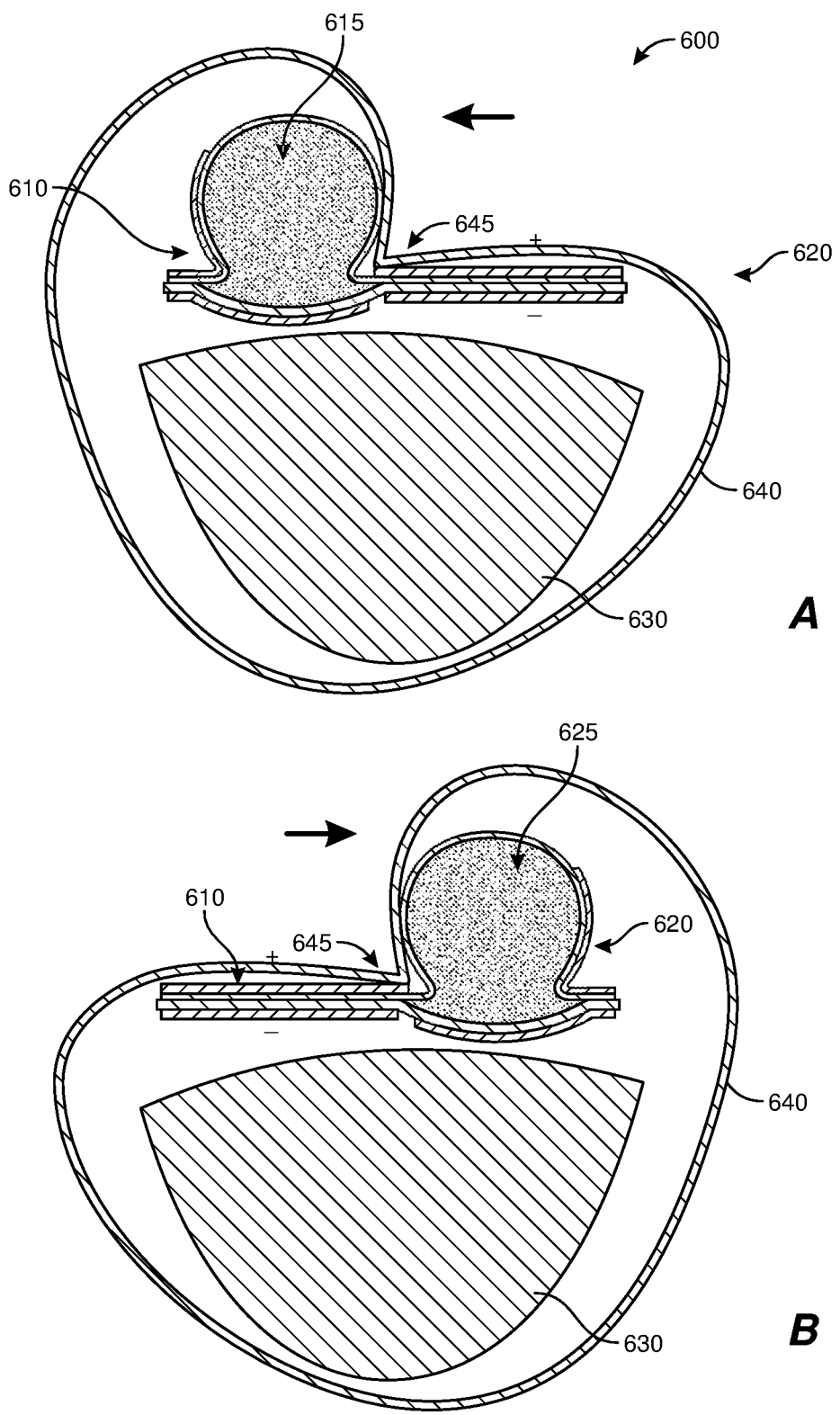
FIG. 6 is a schematic illustration of an electrostatic zipping shear actuator according to certain embodiments.

Two or more electrostatic zipping actuators may be configured to cooperatively operate as a wearable shear actuator. Referring to FIG. 6, shear actuator 600 may include a pair of connected electrostatic zipping actuators 610, 620 (e.g., electrostatic zipping actuators 500), for example, and may be affixed to the body part 630 of a user, such as a finger, using a removable strap 640. The strap 640 may be anchored at anchor point 645 to one or both of the electrostatic zipping actuators. Shear actuator 600 may be bi-directional and may be operated to induce a haptic sensation in the user's body part 630.

By way of example, in certain embodiments, electrostatic zipping actuators 610, 620 may be alternately actuatable. That is, in response to actuation and zipping of actuator 620, tactile bubble 615 associated with zipping actuator 610 may expand and pull strap 640 to the left such that the body part 630 feels a shear to the left. In response to actuation and zipping of zipping actuator 610, tactile bubble 625 associated with zipping actuator 620 may expand and pull strap 640 to the right such that the body part 630 experiences a shear to the right.

Figure 7:
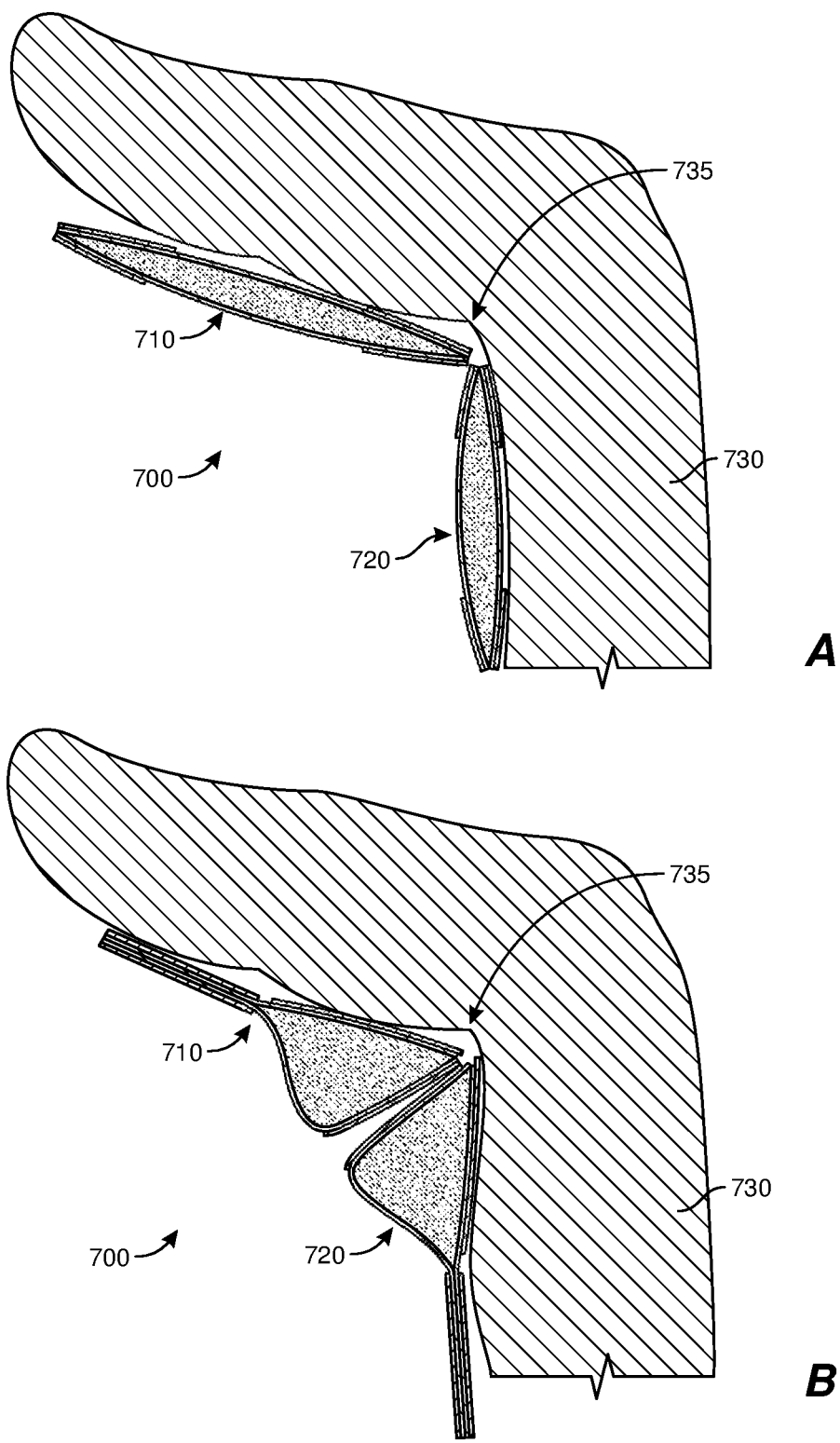
FIG. 7 is a schematic illustration of an electrostatic kinesthetic actuator according to certain embodiments.

According to further embodiments, the electrostatic zipping actuators disclosed herein may be configured as kinesthetic actuators that apply force (e.g., torque) to the body part of a user, which may be used to simulate interaction with an object, such as in a virtual reality environment. That is, a kinesthetic actuator may generate a physical haptic response that creates for the user a sensation of interacting with a virtual object. Referring to FIG. 7, kinesthetic actuator 700 may include a pair of electrostatic zipping actuators 710, 720 (e.g., electrostatic zipping actuators 500) located proximate to the joint 735 of a user's body part 730. FIG. 7A shows actuators 710, 720 in an unactuated state. FIG. 7B shows actuators 710, 720 in an actuated state and the attendant application of pressure and torque to the joint 735 of body part 730.

The electrostatic zipping actuators are shown in FIG. 7 as being positioned at or proximate to joint portions of a user's body part 730, but other positions are also contemplated by the present disclosure. For example, an electrostatic zipping actuator may optionally be positioned along a side of a forefinger portion of a hand and adapted to be depressed by the user's thumb. In this position, the electrostatic zipping actuator may be used as a user input button. Moreover, instead of or in addition to being positioned adjacent to a joint, the electrostatic zipping actuators may be positioned on a palm portion of a hand, on a wristband, on a shoe, on a headband, on a controller, etc. FIG. 7 illustrates a pair of electrostatic zippers 710, 720 each at a joint portion of a user's hand. In additional embodiments, a lesser or greater number of electrostatic zipping actuators may be used.

One or more electrostatic zipping actuators may be incorporated into a device that is configured to be worn about the body part of a user where actuation of the electrostatic zipping actuator(s) may be used to reversibly adjust the fit of the device and/or provide haptic feedback to the user.

Figure 8:
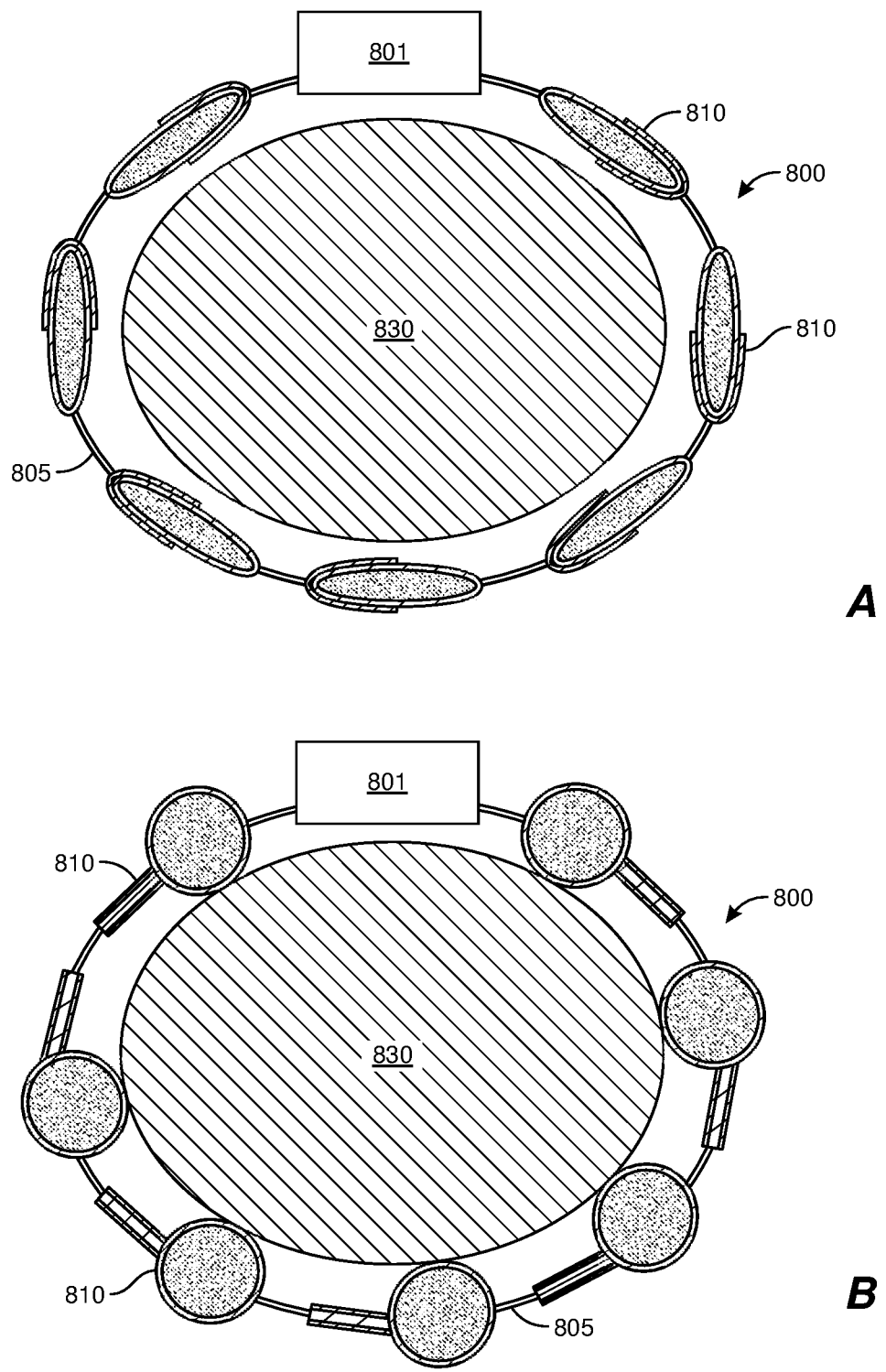
FIG. 8 illustrates the operation of an electrostatic zipping squeeze actuator according to some embodiments.
Figure 9:
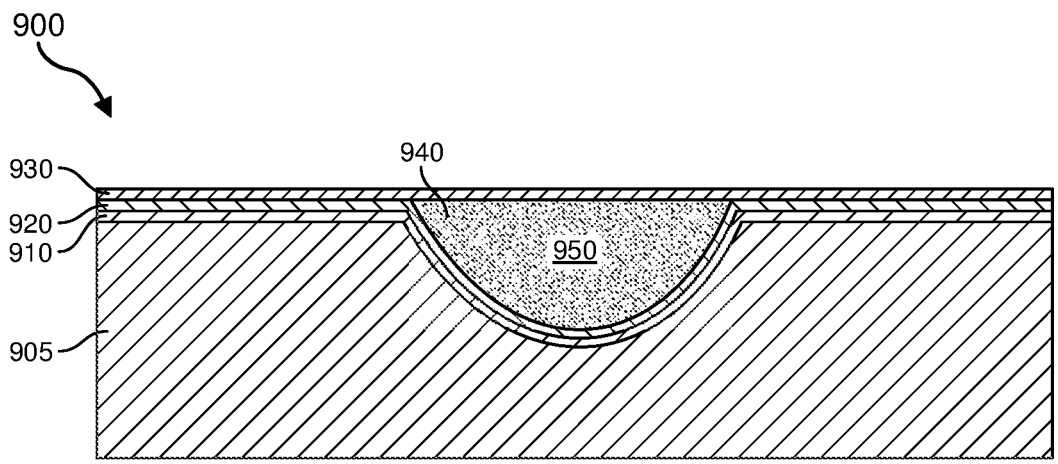
FIG. 9 is a schematic illustration of an electrostatic zipping peristaltic pump according to certain embodiments.
Figure 9:
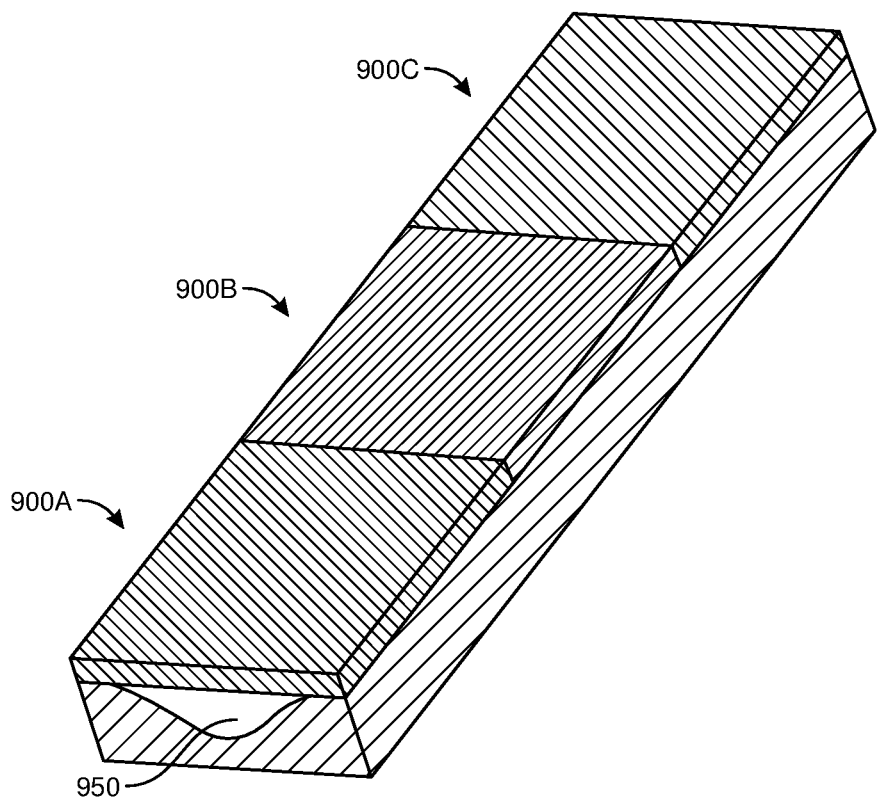

Referring to FIG. 8, wearable apparatus 800 may include any suitable configuration that fits about a user's body part. User body part 830 may represent any body part of a user including, for example, a leg, an ankle, an arm, a wrist, the neck, the waist, the chest, etc. Wearable apparatus 800 may include a band element 805, a device 801 attached to the band element 805 and a plurality of electrostatic zipping actuators 810 harnessed to the band element 805 along a perimeter thereof.

As illustrated in FIG. 8A, in an unactuated state, the band element 805 may fit loosely about the user's body part 830. Referring to FIG. 8B, after actuation, the total length of the band may be decreased due to the deformed shape of the fluid. The shortened band 800 may compress body part 830. For example, actuation of the one or more electrostatic zipping actuators may cause the band element 805 to compress about the user's body part in a substantially uniform manner. Removing the actuation voltage may cause the device to release compression about the user's body part as shown in FIG. 8A.

According to further embodiments, an electrostatic zipping actuator may be adapted to form a pump suitable for pumping liquids. Referring to FIG. 9A, electrostatic zipping actuator 900 may include, from bottom to top, a substrate 905, a primary electrode 910, a dielectric layer 920, and a secondary electrode 930. In some embodiments, a further deformable dielectric layer may be disposed between the dielectric layer 920 and the secondary electrode 930.

In the illustrated embodiment, substrate 905 may include a flow channel 950. The primary electrode 910 and the dielectric layer 920 may include layers that conformally overlie substrate 905, i.e., within flow channel 950. The electrostatic zipping actuator 900 may further include a dielectric fluid 940 located within flow channel 950 and proximate to the interface between the dielectric layer 920 and the secondary electrode 930.

Referring to FIG. 9B, a plurality of zipping actuators 900A, 900B, 900C may be arranged in series with aligned flow channels. In an example method, the zipping actuators 900A, 900B, 900C may be actuated in succession to advance (i.e., pump) air along the combined flow channel.

As disclosed herein, a zipping actuator operable at low voltages (V<1 kV) and capable of exerting high pressures (P~200 kPa) may include an opposing electrode pair (i.e., a primary electrode and a secondary electrode), a thin dielectric layer disposed between the electrodes, and a dielectric fluid located at the interface between at least one of the electrodes (e.g., the primary or zipping electrode) and the dielectric layer. One or both of the electrodes may be flexible such that, under an applied voltage, an electrostatic force generated between the electrodes may draw the electrodes together and correspondingly change the gap dimensions between at least one of the electrodes and the dielectric layer.

Example flexible electrodes may include carbon-doped polydimethylsiloxane, although other flexible, conductive electrode materials are contemplated. The dielectric layer may include silicon dioxide, silicon nitride, or a polymer such as a fluoropolymer, e.g., polytetrafluoroethylene, for example, and may have a thickness of less than approximately 10 micrometers. The dielectric fluid located at the electrode-dielectric layer interface may inhibit dielectric breakdown, such as in actuators where air or another ionizable medium is present between the electrodes, and thus prevent electrical shield effects during operation. The dielectric fluid may be a compressible fluid or an incompressible fluid. In some embodiments, to limit interdiffusion, the dielectric fluid and the polymer matrix of the zipping electrode may have dissimilar solubility parameters, whereas in further embodiments the dielectric fluid-facing surface of the zipping electrode may be pre-treated.

Using partial or full zipping, the zipping actuator may be used to form a valve or a peristaltic pump. In various haptics applications, the zipping actuator may be used to form a tactile bubble, a shear actuator, or a kinesthetic actuator that is configured to interact with the body part of a user. In still further embodiments, opposing arrays of zipping actuators may form an electrostatic motor, such as a linear synchronous machine (LSM).

EXAMPLE EMBODIMENTS

Example 1: A device includes a primary electrode, a secondary electrode overlying the primary electrode, a dielectric layer located between and abutting at least a portion of the primary electrode and the secondary electrode, and a dielectric fluid disposed at least at a junction between the dielectric layer and one of the electrodes, where an average thickness of the dielectric layer is less than approximately 10 micrometers.

Example 2: The device of Example 1, where at least one of the electrodes includes a compliant material.

Example 3: The device of any of Examples 1 and 2, where at least one of the electrodes includes a conductive polymer.

Example 4: The device of any of Examples 1-3, where at least one of the electrodes includes doped polydimethylsiloxane.

Example 5: The device of any of Examples 1-4, where at least one of the electrodes includes a doped semiconductor.

Example 6: The device of any of Examples 1-5, where at least one of the electrodes includes a non-planar region.

Example 7: The device of Example 6, where the non-planar region overlies the dielectric fluid.

Example 8: The device of any of Examples 1-7, where the dielectric layer includes silicon dioxide.

Example 9: The device of any of Examples 1-8, where the average thickness of the dielectric layer is less than approximately 1 micrometer.

Example 10: The device of any of Examples 1-9, where the dielectric layer abuts the primary electrode over a first contact area and the dielectric layer abuts the secondary electrode over a second contact area different than the first contact area.

Example 11: The device of any of Examples 1-10, where the dielectric fluid includes silicone oil or a dielectric ester.

Example 12: The device of any of Examples 1-11, where the dielectric fluid has a fixed volume.

Example 13: The device of any of Examples 1-12, further including a secondary dielectric layer disposed over a surface of the primary electrode between the primary electrode and the dielectric layer.

Example 14: A method includes applying a bias of less than approximately 1 kV between the primary electrode and the secondary electrode of the device of any of Examples 1-13.

Example 15: The method of Example 14, where the applied bias induces a compressive pressure between the primary electrode and the secondary electrode of up to approximately 200 kPa.

Example 16: A method includes (a) coupling motion of a haptic device to motion of a user, where the haptic device includes a dielectric layer located between and abutting at least a portion of a primary electrode and a secondary electrode, and a dielectric fluid disposed at least at a junction between the dielectric layer and one of the electrodes, and (b) applying a bias to at least one of the electrodes to actuate the haptic device and apply pressure or shear to a body part of the user.

Example 17: The method of Example 16, where the haptic device is disposed proximate to a joint of the body part.

Example 18: The method of Example 17, where the haptic device includes a first portion located proximate to a first side of the joint and a second portion located proximate to a second side of the joint opposite to the first side, and actuating the haptic device includes applying a bias simultaneously to the first portion and the second portion.

Example 19: A wearable device includes a garment configured to be worn by a user of the wearable device, and a haptic assembly coupled to a portion of the garment, the haptic assembly including a primary electrode, a secondary electrode overlying the primary electrode, a barrier layer located between and abutting at least a portion of the primary electrode and the secondary electrode, and a dielectric fluid disposed at least at a junction between the barrier layer and one of the electrodes, where the haptic assembly is configured to impede movement of a body part of the user located proximate to the portion of the garment.

Example 20: The wearable device of Example 19, where the garment includes an article selected from a glove, a headband, an armband, a sleeve, a head covering, a sock, a shirt, and pants.

Example 21: The wearable device of any of Examples 19 and 20, where the haptic assembly is disposed proximate to a joint of the body part of the user.

Example 22: The wearable device of any of Examples 19-21, where (a) the haptic assembly is configured to substantially not impede movement of the body part while the haptic assembly is in an unactuated state, and (b) the haptic assembly is configured to substantially impede movement of the body part while the haptic assembly is in an actuated state.

Example 23: The wearable device of any of Examples 19-22, where the haptic assembly is configured to extend a joint of the body part of the user while the haptic assembly is in an actuated state.

Example 24: The wearable device of any of Examples 19-23, where the haptic assembly is configured to impede movement of the user's body part in response to a bias of less than approximately 1 kV being applied between the primary electrode and the secondary electrode.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1000 in FIG. 10) or that visually immerses a user in an artificial reality (e.g., virtual-reality system 1100 in FIG. 11). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 10:
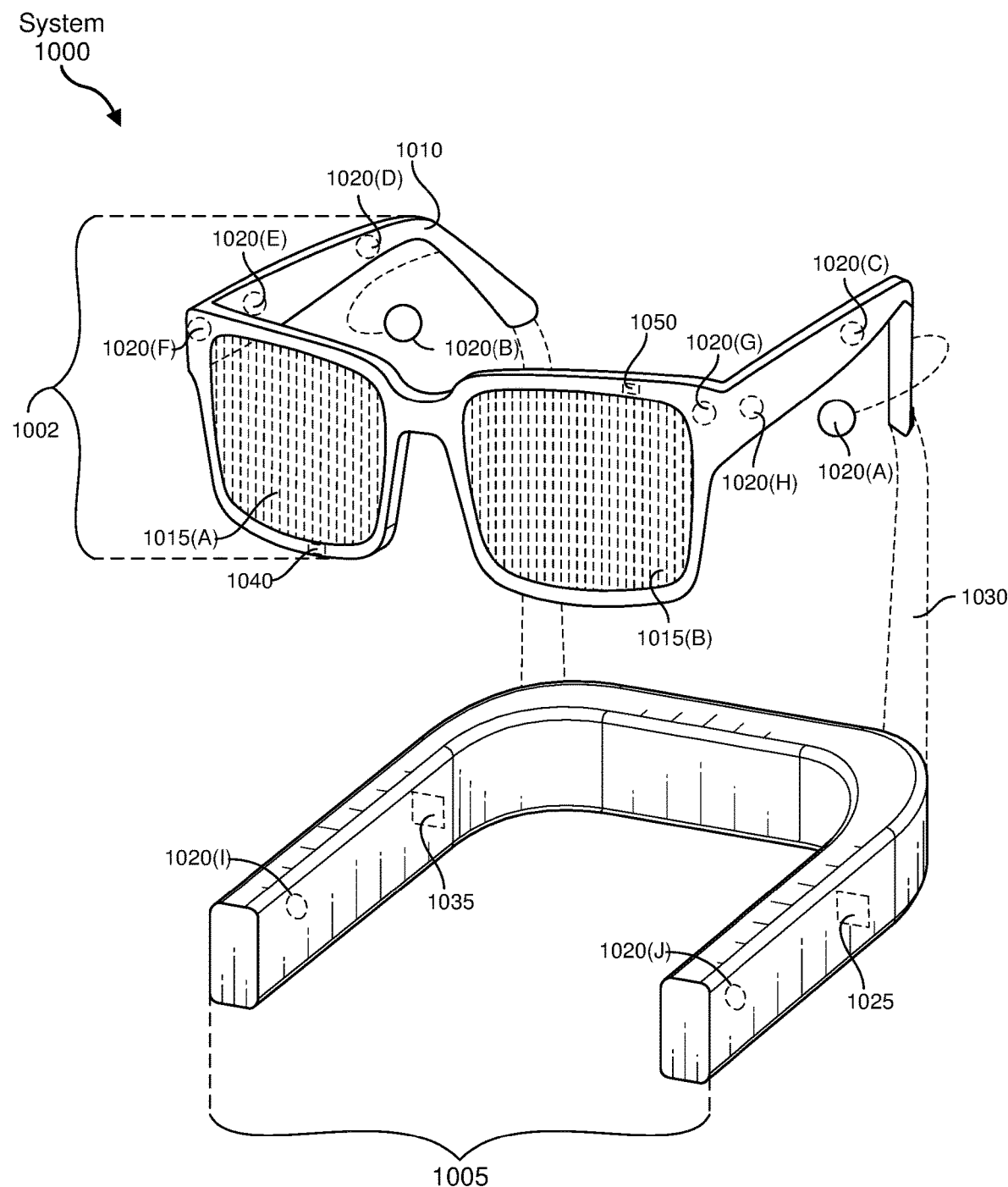
FIG. 10 is an illustration of exemplary augmented-reality glasses that may be used in connection with embodiments of this disclosure.

Turning to FIG. 10, augmented-reality system 1000 may include an eyewear device 1002 with a frame 1010 configured to hold a left display device 1015(A) and a right display device 1015(B) in front of a user's eyes. Display devices 1015(A) and 1015(B) may act together or independently to present an image or series of images to a user. While augmented-reality system 1000 includes two displays, embodiments of this disclosure may be implemented in augmented-reality systems with a single NED or more than two NEDs.

In some embodiments, augmented-reality system 1000 may include one or more sensors, such as sensor 1040. Sensor 1040 may generate measurement signals in response to motion of augmented-reality system 1000 and may be located on substantially any portion of frame 1010. Sensor 1040 may represent a position sensor, an inertial measurement unit (IMU), a depth camera assembly, a structured light emitter and/or detector, or any combination thereof. In some embodiments, augmented-reality system 1000 may or may not include sensor 1040 or may include more than one sensor. In embodiments in which sensor 1040 includes an IMU, the IMU may generate calibration data based on measurement signals from sensor 1040. Examples of sensor 1040 may include, without limitation, accelerometers, gyroscopes, magnetometers, other suitable types of sensors that detect motion, sensors used for error correction of the IMU, or some combination thereof.

Augmented-reality system 1000 may also include a microphone array with a plurality of acoustic transducers 1020(A)-1020(J), referred to collectively as acoustic transducers 1020. Acoustic transducers 1020 may be transducers that detect air pressure variations induced by sound waves. Each acoustic transducer 1020 may be configured to detect sound and convert the detected sound into an electronic format (e.g., an analog or digital format). The microphone array in FIG. 10 may include, for example, ten acoustic transducers: 1020(A) and 1020(B), which may be designed to be placed inside a corresponding ear of the user, acoustic transducers 1020(C), 1020(D), 1020(E), 1020(F), 1020(G), and 1020(H), which may be positioned at various locations on frame 1010, and/or acoustic transducers 1020(I) and 1020(J), which may be positioned on a corresponding neckband 1005.

In some embodiments, one or more of acoustic transducers 1020(A)-(J) may be used as output transducers (e.g., speakers). For example, acoustic transducers 1020(A) and/or 1020(B) may be earbuds or any other suitable type of headphone or speaker.

The configuration of acoustic transducers 1020 of the microphone array may vary. While augmented-reality system 1000 is shown in FIG. 10 as having ten acoustic transducers 1020, the number of acoustic transducers 1020 may be greater or less than ten. In some embodiments, using higher numbers of acoustic transducers 1020 may increase the amount of audio information collected and/or the sensitivity and accuracy of the audio information. In contrast, using a lower number of acoustic transducers 1020 may decrease the computing power required by an associated controller 1050 to process the collected audio information. In addition, the position of each acoustic transducer 1020 of the microphone array may vary. For example, the position of an acoustic transducer 1020 may include a defined position on the user, a defined coordinate on frame 1010, an orientation associated with each acoustic transducer 1020, or some combination thereof.

Acoustic transducers 1020(A) and 1020(B) may be positioned on different parts of the user's ear, such as behind the pinna, behind the tragus, and/or within the auricle or fossa. Or, there may be additional acoustic transducers 1020 on or surrounding the ear in addition to acoustic transducers 1020 inside the ear canal. Having an acoustic transducer 1020 positioned next to an ear canal of a user may enable the microphone array to collect information on how sounds arrive at the ear canal. By positioning at least two of acoustic transducers 1020 on either side of a user's head (e.g., as binaural microphones), augmented-reality device 1000 may simulate binaural hearing and capture a 3D stereo sound field around about a user's head. In some embodiments, acoustic transducers 1020(A) and 1020(B) may be connected to augmented-reality system 1000 via a wired connection 1030, and in other embodiments acoustic transducers 1020(A) and 1020(B) may be connected to augmented-reality system 1000 via a wireless connection (e.g., a Bluetooth connection). In still other embodiments, acoustic transducers 1020(A) and 1020(B) may not be used at all in conjunction with augmented-reality system 1000.

Acoustic transducers 1020 on frame 1010 may be positioned along the length of the temples, across the bridge, above or below display devices 1015(A) and 1015(B), or some combination thereof. Acoustic transducers 1020 may be oriented such that the microphone array is able to detect sounds in a wide range of directions surrounding the user wearing the augmented-reality system 1000. In some embodiments, an optimization process may be performed during manufacturing of augmented-reality system 1000 to determine relative positioning of each acoustic transducer 1020 in the microphone array.

In some examples, augmented-reality system 1000 may include or be connected to an external device (e.g., a paired device), such as neckband 1005. Neckband 1005 generally represents any type or form of paired device. Thus, the following discussion of neckband 1005 may also apply to various other paired devices, such as charging cases, smart watches, smart phones, wrist bands, other wearable devices, hand-held controllers, tablet computers, laptop computers, other external compute devices, etc.

As shown, neckband 1005 may be coupled to eyewear device 1002 via one or more connectors. The connectors may be wired or wireless and may include electrical and/or non-electrical (e.g., structural) components. In some cases, eyewear device 1002 and neckband 1005 may operate independently without any wired or wireless connection between them. While FIG. 10 illustrates the components of eyewear device 1002 and neckband 1005 in example locations on eyewear device 1002 and neckband 1005, the components may be located elsewhere and/or distributed differently on eyewear device 1002 and/or neckband 1005. In some embodiments, the components of eyewear device 1002 and neckband 1005 may be located on one or more additional peripheral devices paired with eyewear device 1002, neckband 1005, or some combination thereof.

Pairing external devices, such as neckband 1005, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1000 may be provided by a paired device or shared between a paired device and an eyewear device, thus reducing the weight, heat profile, and form factor of the eyewear device overall while still retaining desired functionality. For example, neckband 1005 may allow components that would otherwise be included on an eyewear device to be included in neckband 1005 since users may tolerate a heavier weight load on their shoulders than they would tolerate on their heads. Neckband 1005 may also have a larger surface area over which to diffuse and disperse heat to the ambient environment. Thus, neckband 1005 may allow for greater battery and computation capacity than might otherwise have been possible on a stand-alone eyewear device. Since weight carried in neckband 1005 may be less invasive to a user than weight carried in eyewear device 1002, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1005 may be communicatively coupled with eyewear device 1002 and/or to other devices. These other devices may provide certain functions (e.g., tracking, localizing, depth mapping, processing, storage, etc.) to augmented-reality system 1000. In the embodiment of FIG. 10, neckband 1005 may include two acoustic transducers (e.g., 1020(I) and 1020(J)) that are part of the microphone array (or potentially form their own microphone subarray). Neckband 1005 may also include a controller 1025 and a power source 1035.

Acoustic transducers 1020(I) and 1020(J) of neckband 1005 may be configured to detect sound and convert the detected sound into an electronic format (analog or digital). In the embodiment of FIG. 10, acoustic transducers 1020(I) and 1020(J) may be positioned on neckband 1005, thereby increasing the distance between the neckband acoustic transducers 1020(I) and 1020(J) and other acoustic transducers 1020 positioned on eyewear device 1002. In some cases, increasing the distance between acoustic transducers 1020 of the microphone array may improve the accuracy of beamforming performed via the microphone array. For example, if a sound is detected by acoustic transducers 1020(C) and 1020(D) and the distance between acoustic transducers 1020(C) and 1020(D) is greater than, e.g., the distance between acoustic transducers 1020(D) and 1020(E), the determined source location of the detected sound may be more accurate than if the sound had been detected by acoustic transducers 1020(D) and 1020(E).

Controller 1025 of neckband 1005 may process information generated by the sensors on neckband 1005 and/or augmented-reality system 1000. For example, controller 1025 may process information from the microphone array that describes sounds detected by the microphone array. For each detected sound, controller 1025 may perform a direction-of-arrival (DOA) estimation to estimate a direction from which the detected sound arrived at the microphone array. As the microphone array detects sounds, controller 1025 may populate an audio data set with the information. In embodiments in which augmented-reality system 1000 includes an inertial measurement unit, controller 1025 may compute all inertial and spatial calculations from the IMU located on eyewear device 1002. A connector may convey information between augmented-reality system 1000 and neckband 1005 and between augmented-reality system 1000 and controller 1025. The information may be in the form of optical data, electrical data, wireless data, or any other transmittable data form. Moving the processing of information generated by augmented-reality system 1000 to neckband 1005 may reduce weight and heat in eyewear device 1002, making it more comfortable to the user.

Power source 1035 in neckband 1005 may provide power to eyewear device 1002 and/or to neckband 1005. Power source 1035 may include, without limitation, lithium ion batteries, lithium-polymer batteries, primary lithium batteries, alkaline batteries, or any other form of power storage. In some cases, power source 1035 may be a wired power source. Including power source 1035 on neckband 1005 instead of on eyewear device 1002 may help better distribute the weight and heat generated by power source 1035.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1100 in FIG. 11, that mostly or completely covers a user's field of view. Virtual-reality system 1100 may include a front rigid body 1102 and a band 1104 shaped to fit around a user's head. Virtual-reality system 1100 may also include output audio transducers 1106(A) and 1106(B). Furthermore, while not shown in FIG. 11, front rigid body 1102 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1000 and/or virtual-reality system 1100 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1000 and/or virtual-reality system 1100 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1000 and/or virtual-reality system 1100 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 11, output audio transducers 1106(A) and 1106(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 10, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, creating digital art, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 1000 and 1100 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 12:
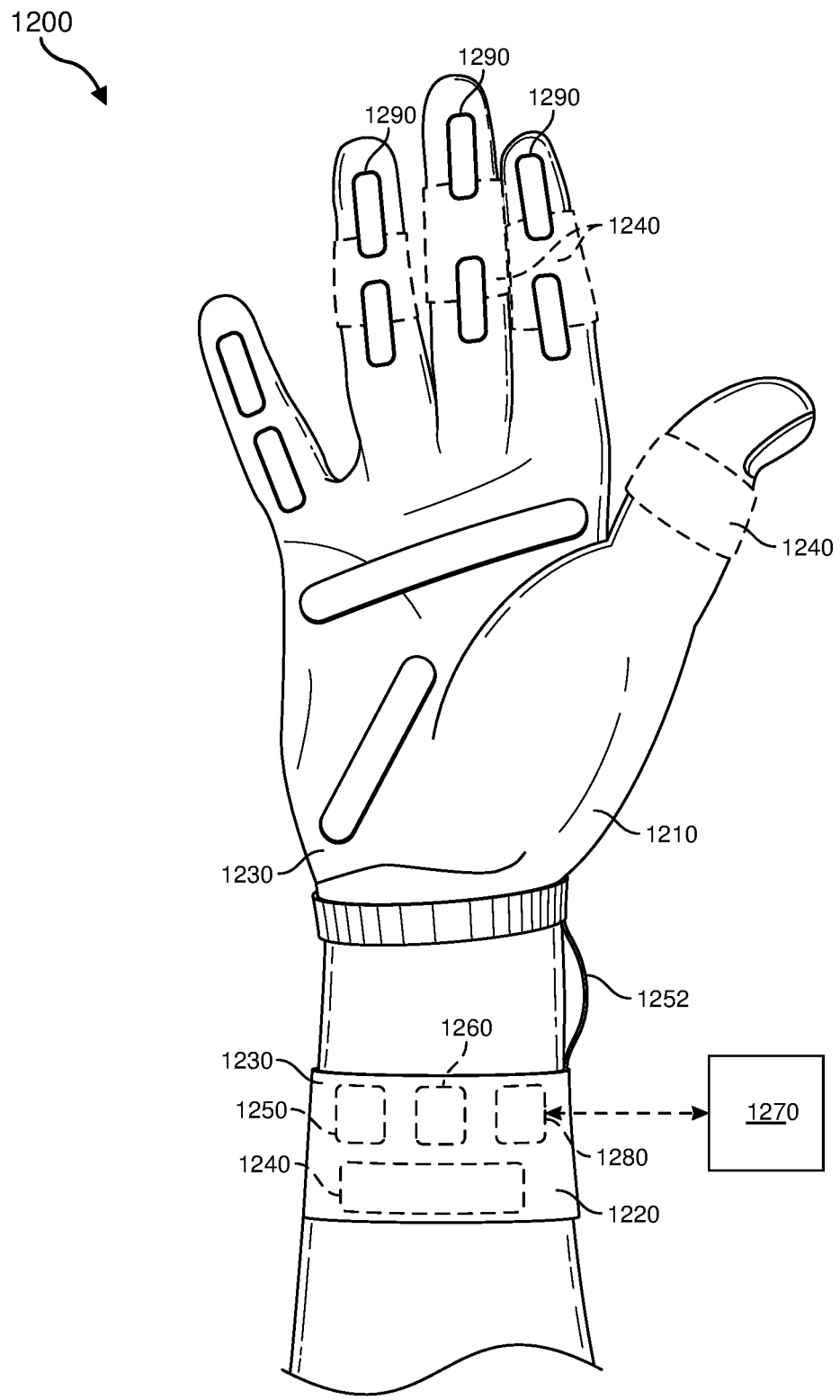
FIG. 12 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 12 illustrates a vibrotactile system 1200 in the form of a wearable glove (haptic device 1210) and wristband (haptic device 1220). Haptic device 1210 and haptic device 1220 are shown as examples of wearable devices that include a flexible, wearable textile material 1230 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a wearable garment such as a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1240 may be positioned at least partially within one or more corresponding pockets formed in textile material 1230 of vibrotactile system 1200. Vibrotactile devices 1240 may be positioned in locations to provide a vibrating sensation (e.g., haptic feedback) to a user of vibrotactile system 1200. For example, vibrotactile devices 1240 may be positioned against the user's finger(s), thumb, or wrist, as shown in FIG. 12. Vibrotactile devices 1240 may, in some examples, be sufficiently flexible to conform to or bend with the user's corresponding body part(s). Vibrotactile devices 1240 may be configured to provide one or more of a shear effect, squeeze effect, kinesthetic effect, etc., and may include an actuator or a plurality of actuators as described herein in connection with FIGS. 4-8.

A power source 1250 (e.g., a battery) for applying a voltage to the vibrotactile devices 1240 for activation thereof may be electrically coupled to vibrotactile devices 1240, such as via conductive wiring 1252. In some examples, each of vibrotactile devices 1240 may be independently electrically coupled to power source 1250 for individual activation. In some embodiments, a processor 1260 may be operatively coupled to power source 1250 and configured (e.g., programmed) to control activation of vibrotactile devices 1240.

Vibrotactile system 1200 may be implemented in a variety of ways. In some examples, vibrotactile system 1200 may be a standalone system with integral subsystems and components for operation independent of other devices and systems. As another example, vibrotactile system 1200 may be configured for interaction with another device or system 1270. For example, vibrotactile system 1200 may, in some examples, include a communications interface 1280 for receiving and/or sending signals to the other device or system 1270. The other device or system 1270 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1280 may enable communications between vibrotactile system 1200 and the other device or system 1270 via a wireless (e.g., Wi-Fi, Bluetooth, cellular, radio, etc.) link or a wired link. If present, communications interface 1280 may be in communication with processor 1260, such as to provide a signal to processor 1260 to activate or deactivate one or more of the vibrotactile devices 1240.

Vibrotactile system 1200 may optionally include other subsystems and components, such as touch-sensitive pads 1290, pressure sensors, motion sensors, position sensors, lighting elements, and/or user interface elements (e.g., an on/off button, a vibration control element, etc.). During use, vibrotactile devices 1240 may be configured to be activated for a variety of different reasons, such as in response to the user's interaction with user interface elements, a signal from the motion or position sensors, a signal from the touch-sensitive pads 1290, a signal from the pressure sensors, a signal from the other device or system 1270, etc.

Although power source 1250, processor 1260, and communications interface 1280 are illustrated in FIG. 12 as being positioned in haptic device 1220, the present disclosure is not so limited. For example, one or more of power source 1250, processor 1260, or communications interface 1280 may be positioned within haptic device 1210 or within another wearable textile.

In some examples, the electrostatic zipping actuator may form a tactile interactive mechanism that may be incorporated into a wearable device. For example, such a tactile interactive mechanism may be positioned on or in a glove such that the electrostatic zipping actuator is positioned over or proximate to a joint portion of the glove. In additional examples, such tactile interactive mechanisms and electrostatic zipping actuators may be positioned in other locations in gloves or in other wearable devices.

Figure 13:
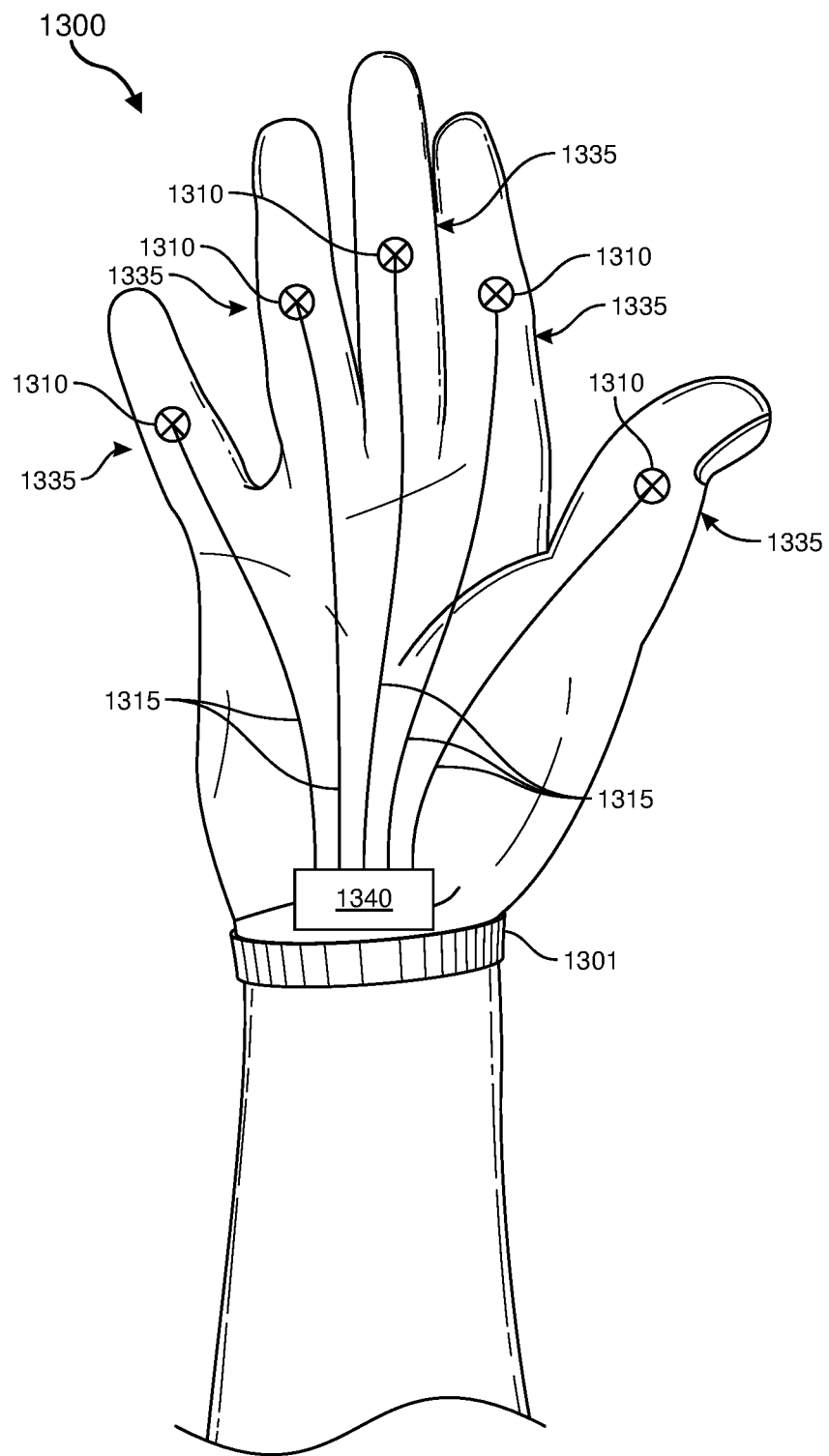
FIG. 13 is an illustration of further exemplary haptic devices that may be used in connection with embodiments of this disclosure.

FIG. 13 is a perspective view of a wearable device 1300 in the form of a glove 1301, according to one implementation of the present disclosure. As shown in FIG. 13, the wearable device 1300 may include zipping actuators 1310 (e.g., a pair of electrostatic zipping actuators 710, 720) respectively positioned proximate to joint portions 1335 of the glove 1301 and configured to apply a localized pressure to the user's fingers when the wearable device 1300 is in use.

A control assembly 1340 configured to actuate zipping actuators 1310 may be coupled (e.g., electrically coupled) to the zipping actuators 1310, such as via respective conduits 1315. The zipping actuators 1310, conduits 1315, and control assembly 1340 may collectively form a kinesthetic interactive mechanism. According to some embodiments, in addition to, or in lieu of, zipping actuators 1310 positioned at joint portions 1335 of wearable device 1300, a wearable device such as glove 1301 may include zipping actuators located at other positions, such as the fingertips or proximate to the palm. Such zipping actuators, in combination with suitable conduits, control assemblies, etc., may form a tactile interactive mechanism or a shear interactive mechanism, for example.

Figure 14:
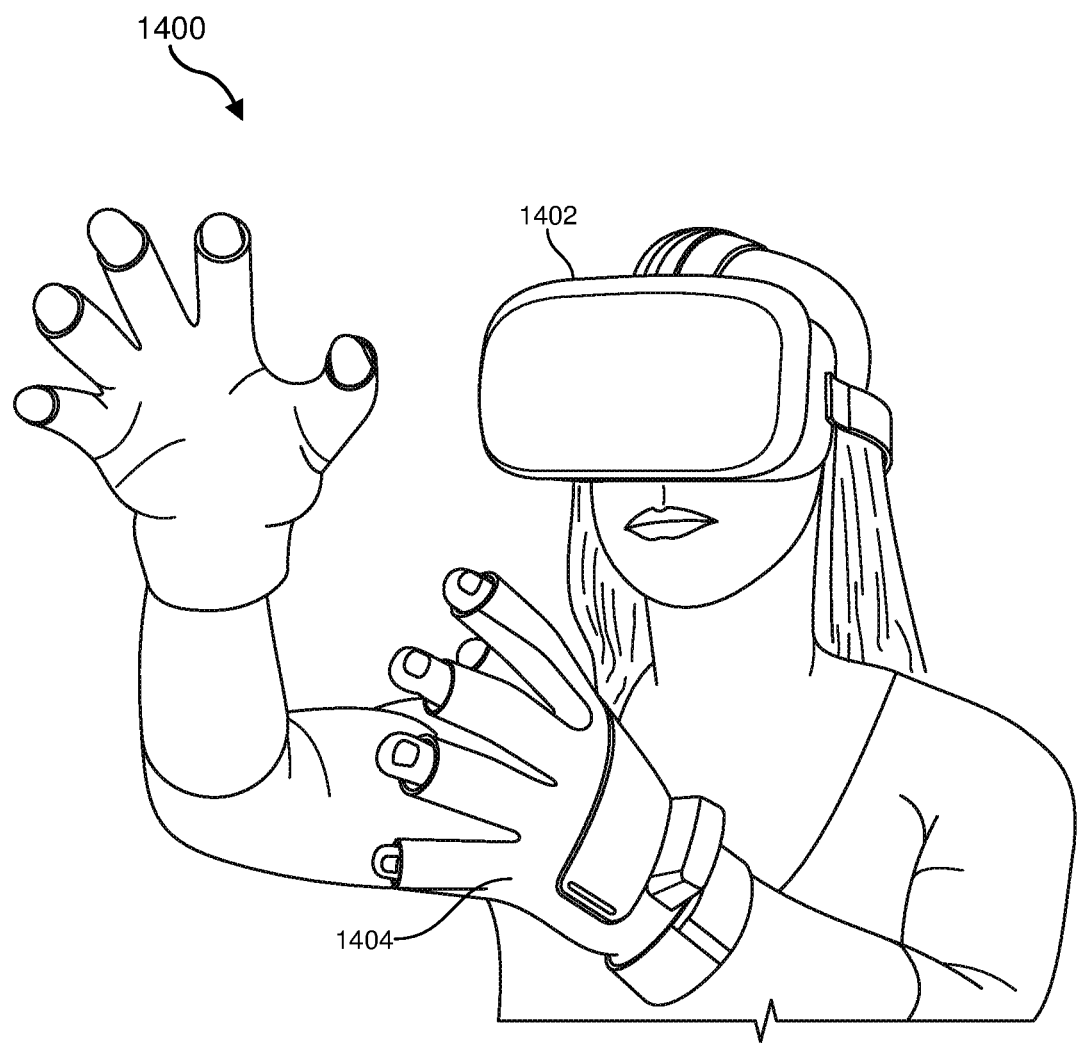
FIG. 14 is an illustration of an exemplary virtual-reality environment according to embodiments of this disclosure.

Haptic wearables, such as those shown in and described in connection with FIG. 12 and FIG. 13, may be implemented in a variety of types of artificial-reality systems and environments. FIG. 14 shows an example artificial-reality environment 1400 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 11:
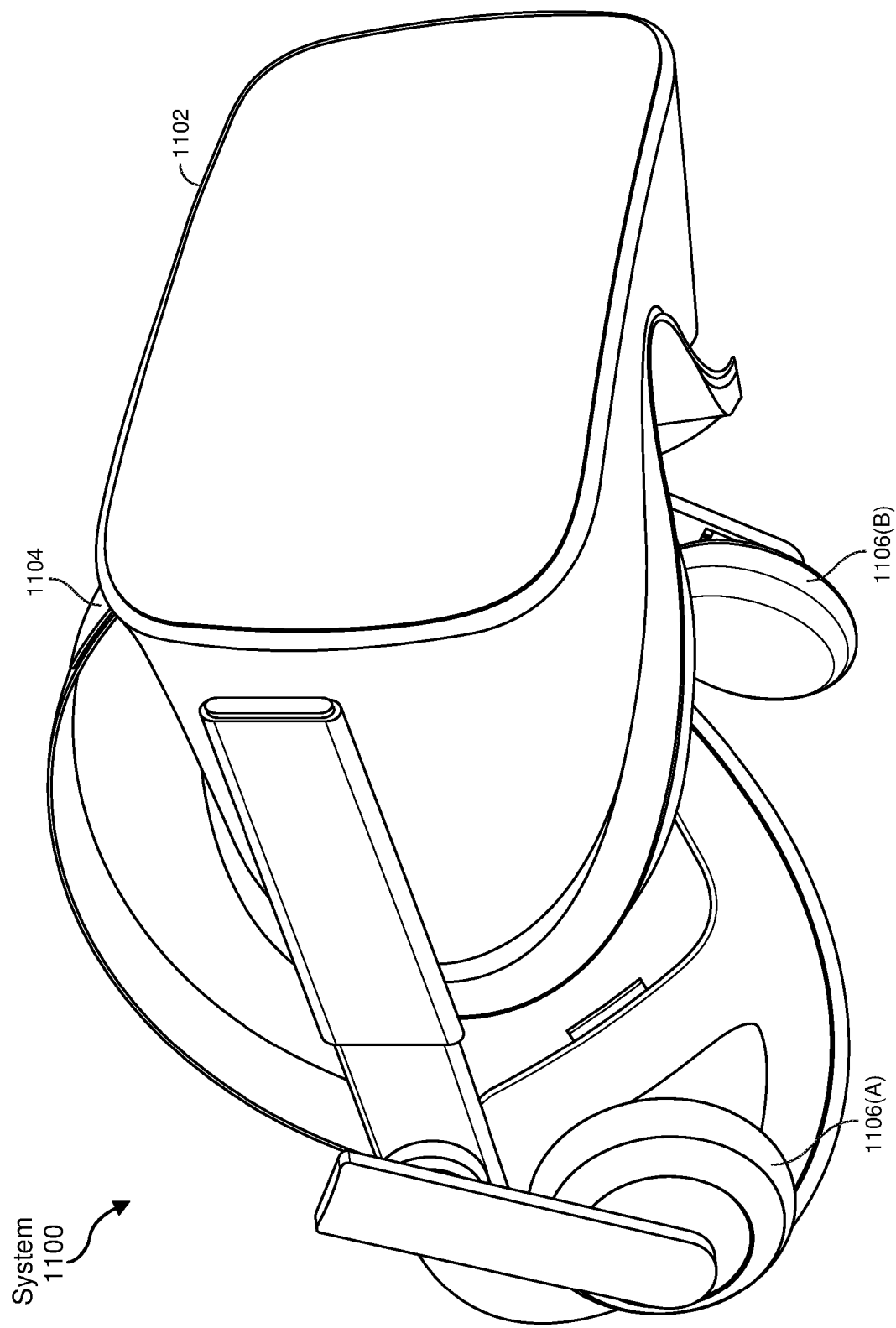
FIG. 11 is an illustration of an exemplary virtual-reality headset that may be used in connection with embodiments of this disclosure.

Head-mounted display 1402 generally represents any type or form of virtual-reality system, such as virtual-reality system 1100 in FIG. 11. Haptic device 1404 generally represents any type or form of wearable device, worn by a user of an artificial-reality system, that provides haptic feedback to the user to give the user the perception that he or she is physically engaging with a virtual object. In some embodiments, haptic device 1404 may provide haptic feedback by applying vibration, motion, and/or force to the user. For example, haptic device 1404 may limit or augment a user's movement. To give a specific example, haptic device 1404 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1404 to send action requests to a console. Examples of action requests include, without limitation, requests to start an application and/or end the application and/or requests to perform a particular action within the application.

Figure 15:
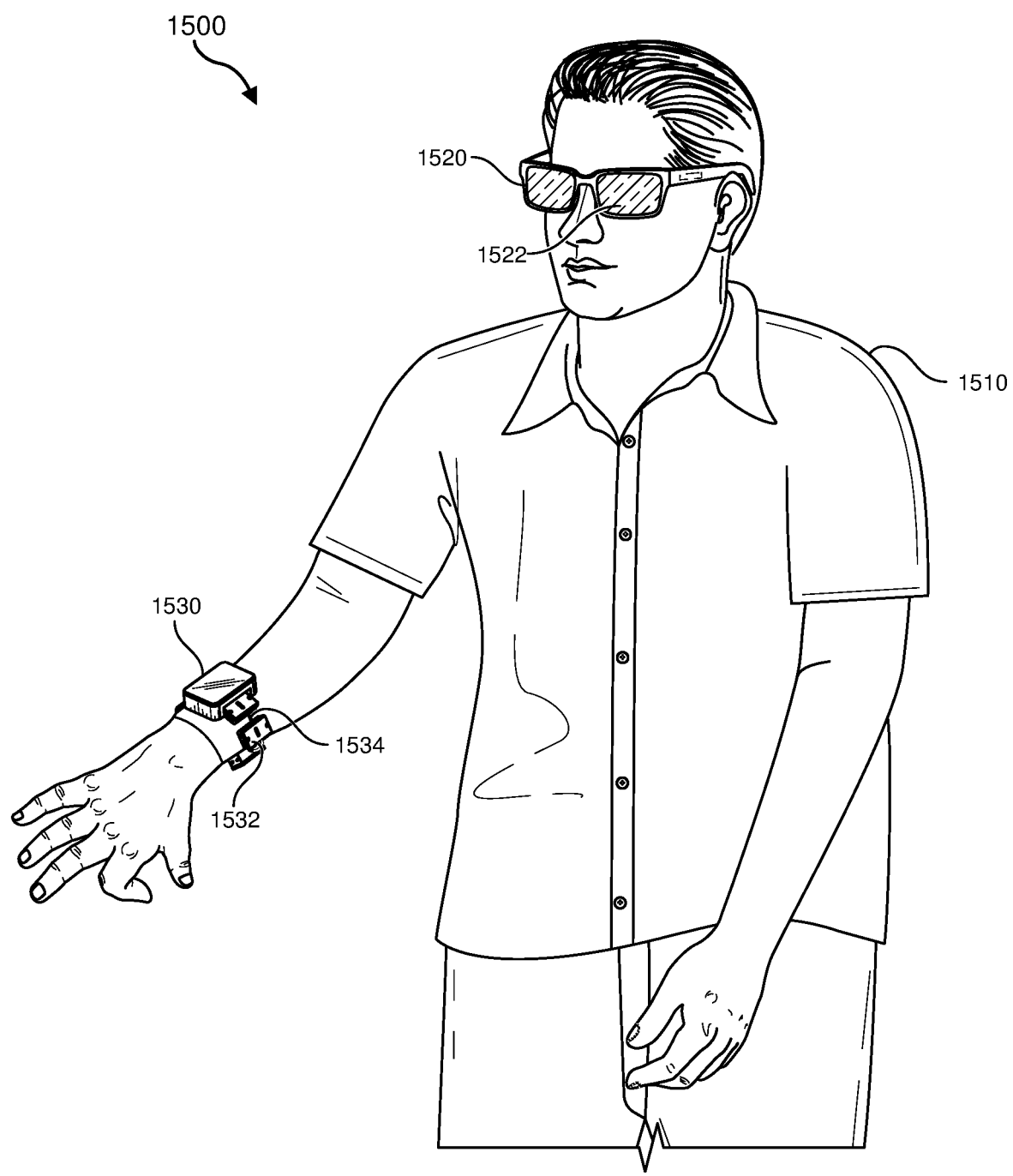
FIG. 15 is an illustration of an exemplary augmented-reality environment according to embodiments of this disclosure.

While haptic interfaces may be used with virtual-reality systems, as shown in FIG. 14, haptic interfaces may also be used with augmented-reality systems, as shown in FIG. 15. FIG. 15 is a perspective view of a user 1510 interacting with an augmented-reality system 1500. In this example, user 1510 may wear a pair of augmented-reality glasses 1520 that may have one or more displays 1522 and that are paired with a haptic device 1530. In this example, haptic device 1530 may be a wristband that includes a plurality of band elements 1532 and a tensioning mechanism 1534 that connects band elements 1532 to one another.

One or more of band elements 1532 may include any type or form of actuator suitable for providing haptic feedback. For example, one or more of band elements 1532 may be configured to provide one or more of various types of cutaneous feedback, including vibration, force, traction, texture, and/or temperature. To provide such feedback, band elements 1532 may include one or more of various types of actuators. In one example, each of band elements 1532 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1210, 1220, 1404, and 1530 may include any suitable number and/or type of haptic transducer, sensor, and/or feedback mechanism. For example, haptic devices 1210, 1220, 1404, and 1530 may include one or more mechanical transducers, piezoelectric transducers, and/or fluidic transducers. Haptic devices 1210, 1220, 1404, and 1530 may also include various combinations of different types and forms of transducers that work together or independently to enhance a user's artificial-reality experience. In one example, each of band elements 1532 of haptic device 1530 may include a vibrotactor (e.g., a vibrotactile actuator) configured to vibrate in unison or independently to provide one or more of various types of haptic sensations to a user.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

In some examples, any relational term, such as "first," "second," "upper," "lower," "on," "over," etc., may be used for clarity and convenience in understanding the disclosure and accompanying drawings and does not connote or depend on any specific preference, orientation, or order, except where the context clearly indicates otherwise.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a dielectric fluid that comprises or includes silicone oil include embodiments where a dielectric fluid consists essentially of silicone oil and embodiments where a dielectric fluid consists of silicone oil.

What is claimed is:

1. A device comprising:
   a primary electrode;
   a secondary electrode overlying the primary electrode, wherein the secondary electrode is movable between an unactuated state spaced away from the primary electrode and an actuated state proximate to the primary electrode;
   a dielectric layer located between and abutting at least a portion of the primary electrode and the secondary electrode;
   a dielectric fluid disposed at least at a junction between the dielectric layer and one of the electrodes, wherein an average thickness of the dielectric layer is less than approximately 10 micrometers; and
   an air gap disposed between the dielectric layer and the one of the electrodes at least when the secondary electrode is in the unactuated state.

2. The device of claim 1, wherein at least one of the electrodes comprises a compliant material.

3. The device of claim 1, wherein at least one of the electrodes comprises a conductive polymer.

4. The device of claim 1, wherein at least one of the electrodes comprises doped polydimethylsiloxane.

5. The device of claim 1, wherein at least one of the electrodes comprises a doped semiconductor.

6. The device of claim 1, wherein at least one of the electrodes comprises a non-planar region.

7. The device of claim 6, wherein the non-planar region overlies the dielectric fluid.

8. The device of claim 1, wherein the dielectric layer comprises silicon dioxide.

9. The device of claim 1, wherein the average thickness of the dielectric layer is less than approximately 1 micrometer.

10. The device of claim 1, wherein the dielectric layer abuts the primary electrode over a first contact area and the dielectric layer abuts the secondary electrode over a second contact area different than the first contact area.

11. The device of claim 1, wherein the dielectric fluid comprises silicone oil or a dielectric ester.

12. The device of claim 1, wherein the dielectric fluid has a fixed volume.

13. The device of claim 1, further comprising a secondary dielectric layer disposed over a surface of the primary electrode between the primary electrode and the dielectric layer.

14. A method comprising:
applying a bias of less than approximately 1 kV between the primary electrode and the secondary electrode of the device of claim 1.

15. The method of claim 14, wherein the applied bias induces a compressive pressure between the primary electrode and the secondary electrode of up to approximately 200 kPa.

16. A wearable device comprising:
a garment configured to be worn by a user of the wearable device; and
a haptic assembly coupled to a portion of the garment, the haptic assembly comprising:
a primary electrode;
a secondary electrode overlying the primary electrode, wherein the secondary electrode is movable between an unactuated state spaced away from the primary electrode and an actuated state proximate to the primary electrode;
a dielectric barrier layer located between and abutting at least a portion of the primary electrode and the secondary electrode; and
a dielectric fluid disposed at least at a junction between the dielectric barrier layer and one of the electrodes, wherein an average thickness of the dielectric barrier layer is less than approximately 10 micrometers; and
an air gap disposed between the dielectric barrier layer and the one of the electrodes at least when the secondary electrode is in the unactuated state.

17. The wearable device of claim 16, wherein the garment comprises an article selected from the group consisting of a glove, a headband, an armband, a sleeve, a head covering, a sock, a shirt, and pants.

18. The wearable device of claim 16, wherein the haptic assembly is disposed proximate to a joint of the body part of the user.

19. The wearable device of claim 16, wherein (a) the haptic assembly is configured to substantially not impede movement of the body part while the haptic assembly is in an unactuated state, and (b) the haptic assembly is configured to substantially impede movement of the body part while the haptic assembly is in an actuated state.

20. The wearable device of claim 16, wherein the haptic assembly is configured to extend a joint of the body part of the user while the haptic assembly is in an actuated state.

21. The wearable device of claim 16, wherein the haptic assembly is configured to impede movement of the user's body part in response to a bias of less than approximately 1 kV being applied between the primary electrode and the secondary electrode.

* * * * *